United States Patent
Nakasato et al.

(10) Patent No.: US 7,745,938 B2
(45) Date of Patent: Jun. 29, 2010

(54) CIRCUIT DEVICE, A METHOD FOR MANUFACTURING A CIRCUIT DEVICE, AND A SEMICONDUCTOR MODULE

(75) Inventors: Mayumi Nakasato, Ogaki (JP); Hideki Mizuhara, Ichinomiya (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 15 days.

(21) Appl. No.: 12/039,054

(22) Filed: Feb. 28, 2008

(65) Prior Publication Data
US 2008/0203578 A1 Aug. 28, 2008

(30) Foreign Application Priority Data
Feb. 28, 2007 (JP) ............... 2007-050757

(51) Int. Cl.
*H01L 23/48* (2006.01)
*H01L 23/52* (2006.01)
*H01L 29/40* (2006.01)

(52) U.S. Cl. ................. 257/773; 257/734; 257/737; 257/775; 257/780

(58) Field of Classification Search ......... 257/734, 257/750, 758, 781, 737, 773, 775, 780
See application file for complete search history.

(56) References Cited

U.S. PATENT DOCUMENTS

| | | | |
|---|---|---|---|
| 4,134,848 A | 1/1979 | Adicoff et al. | |
| 4,335,180 A | 6/1982 | Traut | |
| 4,352,239 A * | 10/1982 | Pierce | 438/660 |
| 4,438,450 A * | 3/1984 | Sheng et al. | 257/767 |
| 4,845,543 A * | 7/1989 | Okikawa et al. | 257/738 |
| 5,055,342 A | 10/1991 | Markovich et al. | |
| 5,144,536 A | 9/1992 | Tsukada et al. | |
| 5,316,803 A | 5/1994 | White et al. | |
| 5,607,744 A | 3/1997 | Diener et al. | |
| 5,972,482 A | 10/1999 | Hatakeyama et al. | |
| 6,038,133 A | 3/2000 | Nakatani et al. | |
| 6,090,701 A * | 7/2000 | Hasunuma et al. | 438/632 |
| 6,143,207 A * | 11/2000 | Yamada et al. | 252/515 |
| 6,285,082 B1 * | 9/2001 | Joshi et al. | 257/750 |

(Continued)

FOREIGN PATENT DOCUMENTS

JP 04354337 A * 12/1992

(Continued)

OTHER PUBLICATIONS

Apr. 16, 2009 Office action in U.S. Appl. No. 11/957,030.

*Primary Examiner*—Leonardo Andújar
*Assistant Examiner*—Teresa M Arroyo
(74) *Attorney, Agent, or Firm*—Fish & Richardson P.C.

(57) ABSTRACT

A circuit device includes a semiconductor substrate on which a circuit element is formed, an electrode formed on a surface of the semiconductor substrate, an insulating layer formed on the electrode, a second wiring layer formed on the insulating layer, and a conductive bump which penetrates the insulating layer and electrically connects the electrode and the second wiring layer. The conductive bump is such that the size of crystal grains in a direction parallel with the surface of the semiconductor substrate is larger than the size of crystal grains in a conduction direction of the electrode and the wiring layer.

11 Claims, 7 Drawing Sheets

U.S. PATENT DOCUMENTS

| | | | |
|---|---|---|---|
| 6,306,756 B1 * | 10/2001 | Hasunuma et al. | 438/632 |
| 6,459,047 B1 | 10/2002 | Japp et al. | |
| 6,528,145 B1 | 3/2003 | Berger et al. | |
| 6,796,025 B2 * | 9/2004 | Imamura et al. | 29/840 |
| 6,896,953 B2 | 5/2005 | Taga et al. | |
| 7,187,005 B2 * | 3/2007 | Koo et al. | 257/72 |
| 7,315,083 B2 | 1/2008 | Igarashi et al. | |
| 7,335,910 B2 * | 2/2008 | Kato et al. | 257/57 |
| 7,619,255 B2 * | 11/2009 | Tanaka et al. | 257/72 |
| 2002/0096768 A1 * | 7/2002 | Joshi | 257/750 |
| 2002/0185309 A1 * | 12/2002 | Imamura et al. | 174/261 |
| 2003/0168495 A1 * | 9/2003 | Biedorf et al. | 228/180.21 |
| 2004/0217353 A1 * | 11/2004 | Koo et al. | 257/72 |
| 2006/0049483 A1 * | 3/2006 | Lin et al. | 257/531 |
| 2007/0082183 A1 | 4/2007 | Murai et al. | |
| 2008/0157338 A1 | 7/2008 | Nakasato et al. | |

FOREIGN PATENT DOCUMENTS

| | | |
|---|---|---|
| JP | 05-235544 | 9/1993 |
| JP | 09-289264 | 11/1997 |
| JP | 09-312479 | 12/1997 |
| JP | 11-298143 | 10/1999 |
| JP | 2001-144206 | 5/2001 |
| JP | 2004-193297 | 7/2004 |
| JP | 2004-288795 | 10/2004 |
| JP | 2005-286041 | 10/2005 |

* cited by examiner

CIRCUIT DEVICE, A METHOD FOR MANUFACTURING A CIRCUIT DEVICE, AND A SEMICONDUCTOR MODULE

CROSS-REFERENCE TO RELATED APPLICATIONS

This application is based upon and claims the benefit of priority from the prior Japanese Patent Application No. 2007-050757, filed on Feb. 28, 2007, the entire contents of which are incorporated herein by reference.

BACKGROUND OF THE INVENTION

1. Field of the Invention

The present invention relates to a circuit device, a method for manufacturing a circuit device, and a semiconductor module.

2. Description of the Related Art

In recent years, along with the on-going downsizing and functional sophistication of electronic devices, there has been an ever-growing demand for smaller circuit devices to be incorporated into electronic devices. One of known ways to meet such a demand is to narrow the pitch of external connection electrodes of a circuit device. But because of the size of solder bumps themselves used as the electrodes and the formation of bridges at soldering, there has existed a limit to the downsizing by narrowing the pitch of the external connection electrodes of a circuit device. For further downsizing of a circuit device, therefore, there is a technology conceived for rearrangement of external connection electrodes by forming a rewiring for a circuit device.

In such a technology, copper rewiring, electrode terminal forming and resin sealing are executed in a wafer level and then a wafer-level packaging (hereinafter referred to as "WLP") is carried out in a chip state. For example, in a known WLP method, metal posts for element electrodes are formed by electroplating using a conductive metal such as copper or gold.

An electrolytic plating of copper, which is a kind of electroplating as mentioned above, is generally performed in a copper sulfate bath, and a soluble phosphorus-containing copper is used as an anode. When a phosphorus-containing copper anode is used, a black film composed of copper phosphide, copper chloride or the like is formed on the surface of the anode by the electrolysis, with the result that the generation of metallic copper or oxidized copper due to a disproportionation reaction of monovalent copper and the generation of particles can be suppressed.

However, when the phosphorus-containing copper anode dissolves, not only copper but also phosphorus solves out into the liquid, so that the plating solution gets contaminated with phosphorus, and the phosphorus codeposits in a plating film. As a result, the copper posts formed by this electrolytic plating has an increased degree of hardness because of the phosphorus contained as impurities, and thus they can present a problem of lowered connection reliability under stresses.

SUMMARY OF THE INVENTION

The present invention has been made in view of the foregoing circumstances, and a general purpose thereof is to provide a technology for improving the connection reliability of wiring of a circuit device.

In order to solve the foregoing problems, a circuit device according to one embodiment of the present invention comprises: a substrate on which a circuit element is formed; a first wiring layer formed on a surface of the substrate; an insulating layer formed on the first wiring layer; a second wiring layer formed on the insulating layer; and a conductor which penetrates the insulating layer and which electrically connects the first wiring layer to the second wiring layer. The conductor is such that the size of crystal grains in a direction parallel with the surface of the substrate is larger than the size of crystal grains in a conduction direction of the first wiring layer and the second wiring layer.

According to this embodiment, the size of crystal grains in a direction parallel to the surface of the substrate is larger than the size of crystal grains in a conduction direction. Hence, compared with a case where the size of crystal grains in the direction parallel to the surface of the substrate is the same or smaller than the size thereof in the conduction direction, the conductor has a shorter total length of respective crystal grain boundaries at the surface in contact with the second wiring layer (hereinafter this will be simply referred to as "total length" also). In other words, the area occupied by the crystal boundaries at the surface where the conductor is in contact with the second wiring layer is smaller in proportion. Consequently, it is possible to suppress the impurities or the like from entering into the conductor through the crystal grain boundaries, for instance, when the second wiring layer is formed on the upper surface of the conductor. As a result, the conductor is less likely to be eroded by impurities or the like, and thus the connection reliability between the conductor and the second wiring layer can be improved. Also, impurities or the like are less likely to reach the inside of a circuit element through the conductor or the first wiring layer, so that malfunction of the circuit element can be avoided. Since the size of crystal grains in the direction parallel to the surface of the substrate is larger than the size thereof in the conduction direction, the total length of crystal grain boundaries of the conductor is also shorter at the contact surface between the conductor and the first wiring layer. In other words, the area occupied by the crystal boundaries at the surface where the conductor is in contact with the first wiring layer is smaller in proportion. Consequently, the conductor has more area where crystal portions having relatively lower resistance than the crystal grain boundaries are in contact with the first wiring layer, thereby making the contact resistance between the conductor and the first wiring layer smaller. As a result, useless heat generation can be prevented and the reduction in power consumed by the circuit device can be achieved.

The conductor may be a rolled material where an anisotropy in the size of crystal grains thereof is formed by a rolling process. According to this embodiment, the conductor displays an improved rupture strength. Thus, compared with a case where the conductor is formed by plating or the like, the conductor is less likely to break when it is under stress, and this improves the connection reliability of the wiring.

The conductor may have a side face formed at an obtuse angle with a face in contact with the surface of the substrate. Or the conductor may be formed in such a manner that the area of cross section in parallel with the surface of the substrate increases as it approaches the second wiring layer from the first wiring layer. Accordingly, for example, when the stress in the direction parallel to the surface of the substrate works at a connection between the conductor and the second wiring layer, the force in which the conductor is pressed against the first wiring layer increases. This means a closer contact between the conductor and the first wiring layer, which means an improved connection reliability.

Another embodiment of the present invention relates to a semiconductor module. This module incorporates a plurality of the above-described circuit devices. The semiconductor module may have a wiring structure where each of the plurality of circuit devices conducts electrically to an external connection terminal.

Still another embodiment of the present invention relates to a method for manufacturing a circuit device. This method includes: a first process of forming a conductor on one of surfaces of an insulating layer; a second process of forming a first wiring layer on a surface of a substrate on which the circuit device is formed; a third process of embedding the conductor in the insulating layer by press-bonding the substrate and the insulating layer in a state where the first wiring layer is in contact with the conductor; a fourth process of exposing the conductor from the other surface of the insulating layer; and a fifth process of providing a second wiring layer in a position, where the conductor is exposed, and on the insulating layer. In this method, the conductor is formed in such a manner that the size of crystal grains in a direction parallel with the surface of the substrate is larger than the size of crystal grains in a conduction direction of the first wiring layer and the second wiring layer.

According to this embodiment, the conductor is formed in such a manner that the size of crystal grains in the direction parallel to the surface of the substrate is larger than the size of crystal grains in the conduction direction. Hence, compared with a case where the size of crystal grains in the direction parallel to the surface of the substrate is the same or smaller than the size thereof in the conduction direction, a total length of crystal grain boundaries at the surface in contact with the second wiring layer becomes shorter. In other words, the area occupied by the crystal boundaries at the surface where the conductor is in contact with the second wiring layer is smaller in proportion. Consequently, it is possible to suppress the impurities or the like from entering into the conductor through the crystal grain boundaries, for instance, when the second wiring layer is formed on the upper surface of the conductor. As a result, a circuit device can be manufactured where the conductor is less likely to be eroded by impurities or the like and the connection reliability between the conductor and the second wiring layer is improved. Also, impurities or the like are less likely to reach the inside of a circuit element through the conductor or the first wiring layer, so that malfunction of the circuit element can be avoided. Since the size of crystal grains in the direction parallel to the surface of the substrate is larger than the size thereof in the conduction direction, the total length of crystal grain boundaries of the conductor is also shorter at the contact surface between the conductor and the first wiring layer. In other words, the area occupied by the crystal boundaries at the surface where the conductor is in contact with the first wiring layer is smaller in proportion. Consequently, the conductor has more area where crystal portions having relatively lower resistance than the crystal grain boundaries are in contact with the first wiring layer, thereby making the contact resistance between the conductor and the first wiring layer smaller. As a result, useless heat generation can be prevented and the reduction in power consumed by the circuit device can be achieved.

In the first process, the conductor may be formed using a rolled material where an anisotropy in the size of crystal grains thereof is formed by a rolling process. This makes it possible to form a conductor with greater ease and lower cost than when the conductor is formed by plating.

In the first process, the conductor may be formed such that the conductor has a side face formed at an acute angle with a face in contact with the insulating layer. Or, in the first process, the conductor may be formed in such a manner that the area of cross section parallel to the surface of the insulating layer decreases in a direction perpendicular to the surface of the insulating layer. As a result, the conductor, which is embedded in the insulating layer in the third process, has a larger area of the portion thereof facing the other face of the insulating layer than the area of the face thereof in contact with the first wiring layer. This makes positioning easier, for example, for via formation to expose the conductor from the other face of the insulating layer, which in turn contributes to reducing the manufacturing cost.

Still another embodiment of the present invention relates also to a method for manufacturing a circuit device. This method includes: an embedding process of embedding a conductor in an insulating layer by press-bonding a substrate and the insulating layer in a state where a first wiring layer formed on the surface of the substrate on which the circuit device is formed is in contact with the conductor formed on one of surfaces of the insulating layer; an exposing process of exposing the conductor from the other surface of the insulating layer; and a wiring process of providing a second wiring layer in a position, where the conductor is exposed, and on the insulating layer. In this method, the conductor is formed in such a manner that the size of crystal grains in a direction parallel with the surface of the substrate is larger than the size of crystal grains in a conduction direction of the first wiring layer and the second wiring layer.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

The embodiments will now be described with reference to drawings. Note that in all of the Figures the same components are given the same reference numerals and the repeated description thereof is omitted as appropriate. The structures described hereinbelow are only exemplary and does not limit the scope of the present invention.

First Embodiment

Structure of a Circuit Device

Figure 1:
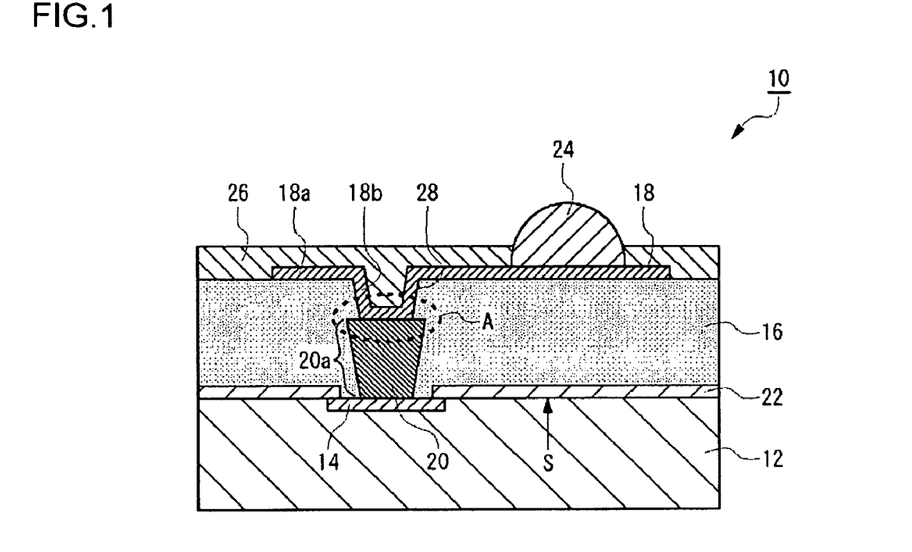
FIG. 1 is a schematic cross-sectional view illustrating a structure of a circuit device according to a first embodiment of the present invention.

FIG. 1 is a schematic cross-sectional view illustrating a structure of a circuit device according to a first embodiment of the present invention. As shown in FIG. 1, a circuit device 10 according to the first embodiment includes a semiconductor substrate 12 with a predetermined circuit element (not shown) such as an electric circuit formed by a known technology on a surface S (upper-face side) thereof, an electrode 14 of the circuit element, which is part of a first wiring layer formed on the surface S (especially in the peripheral part) serving as the mounting face of the semiconductor substrate 12, an insulating layer 16 disposed on the electrode 14, a second wiring layer 18 disposed on the insulating layer 16, and a conductive bump 20 which serves as a conductor electrically connecting the electrode 14 to the second wiring layer 18 by penetrating through the insulating layer 16.

Formed on the face of the semiconductor substrate 12 is a protective film 22 in such a manner that it has a predetermined region exposing the electrode 14. To widen the pitch of adjacent electrodes 14, a rewiring pattern 18a is formed on the insulating layer 16 which is provided on the top of the electrode 14 and the protective film 22. Connection between the electrode 14 and the rewiring pattern 18a is made via the conductive bump 20 in contact with the exposed surface of the electrode 14 and a via contact 18b in contact with the conductive bump 20. Provided on a predetermined region of the rewiring pattern 18a is a solder bump 24, which serves as an external connection electrode, and the rewiring pattern 18a is covered by a solder resist layer 26 except in the region where the solder bump 24 is provided.

More specifically, the insulating layer 16 is disposed above the surface S of the semiconductor substrate 12, and the thickness thereof is, for instance, about 80 μm. The insulating layer 16 is formed of a material that develops plastic flow under pressure. An epoxy thermosetting resin is one example of material that develops plastic flow under pressure. A desirable epoxy thermosetting resin to form the insulating layer 16 is more preferably a material that has a viscosity of about 1 kPa·s at a temperature of 160° C. and a pressure of 8 MPa. When placed under a pressure of 15 MPa at a temperature of 160° C., the viscosity of this resin material drops to about ⅛ of that without the pressurization.

The epoxy thermosetting resin may be a type of film in which woven glass fiber is impregnated with resin. Or, otherwise, the insulating layer may be a film added with a filler of about 2 to 10 μm diameter. The filler material is preferably alumina ($Al_2O_3$), silica ($SiO_2$), aluminum nitride (AlN), silicon nitride (SiN), boron nitride (BN), or the like. The filling rate of the filler in weight is preferably about 30 to 80%.

The conductive bump 20 may be made of a metal such as copper (Cu) or aluminum (Al). The conductive bump 20 of a circuit device 10 according to the present embodiment, however, is a copper foil formed by a rolling process. Hence, the conductive bump 20 shows an anisotropy in the size of crystal grains of the copper material. More specifically, the conductive bump 20 has the size of crystal grains in the direction parallel with the surface S of the semiconductor substrate 12 larger than the size of crystal grains in the conduction direction between the electrode 14 and the second wiring layer 18 (direction perpendicular to the surface S). For example, the average longitudinal size of crystal grains of the copper foil formed by a rolling process is about 80 to 100 μm, whereas the average lateral size of crystal grains thereof is about 15 μm.

The height of the conductive bump 20 is, for instance, about 50 μm. The conductive bump 20 according to the present embodiment, which is disposed as a circular truncated cone (trapezoidal in cross section), has a tip end, which is in parallel with the contact face of the electrode 14, and a side face part 20a, which is formed increasingly smaller in diameter (size) closer to the tip end. That is, the conductive bump 20 has a side face part 20a formed at an obtuse angle with the face in contact with the surface S of the semiconductor substrate 12. In other words, the conductive bump 20 is formed in such a manner that the area of cross section in parallel with the surface S of the semiconductor substrate 12 increases as it approaches the second wiring layer 18 from the electrode 14. The diameter of the tip end of the conductive bump 20 and the diameter of the face in contact with the second wiring layer 18 are about 80 μmφ and about 100 μmφ, respectively. The conductive bump 20 is disposed in a position corresponding to the electrode 14. And the tip end of the conductive bump 20 is so formed that it comes in direct contact with the electrode 14.

The rewiring pattern 18a is formed on the insulating layer 16, and the thickness thereof is, for instance, about 20 μm. The rewiring pattern 18a, which is formed of a metal such as copper (Cu), is electrically connected to the conductive bump 20 via the via contact 18b, which is disposed within an opening 28 in the insulating layer 16. The width of the opening 28 is about 100 μm. The via contact 18b is disposed in such a manner as to cover the inner surface of the opening 28, and is formed integrally with the rewiring pattern 18a. It is to be noted that because of the presence of the conductive bump 20 on the electrode 14, the depth of the via contact 18b (opening 28) is about 30 μm, which can be shallower than when the via contact (opening) is formed directly on the electrode 14.

As described above, the circuit device 10 according to the present embodiment has a rewiring pattern 18a formed to be coupled with the electrode 14 formed on the surface S of the semiconductor substrate 12 via the conductive bump 20 and the via contact 18b, so that rearrangement of the solder bump 24, which is an external connection electrode, can be effected.

(Conductive Bump)

Figure 2:
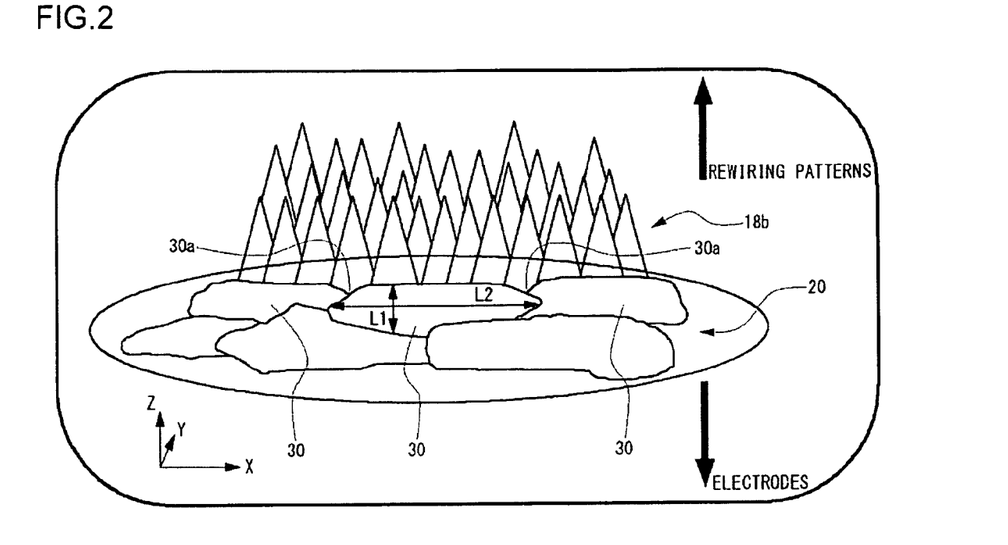
FIG. 2 schematically illustrates crystal grains in an interface zone A of a conductive bump and a via contact shown in FIG. 1.

Now, the conductive bump 20, formed with a copper foil, will be discussed in detail. FIG. 2 schematically illustrates crystal grains in the interface zone A of the conductive bump 20 and the via contact 18b shown in FIG. 1. As shown in FIG. 2, the conductive bump 20 has size L2 of the crystal grains 30 in the X or Y direction parallel to the surface S of the semiconductor substrate 12 larger than size L1 thereof in the conduction direction Z between the electrode 14 and the second wiring layer 18.

Accordingly, compared with the case where size L2 of the crystal grains 30 in the direction parallel to the surface of the semiconductor substrate is the same or smaller than size L1 thereof in the conduction direction Z shown in FIG. 2, the conductive bump 20 has a shorter total length of crystal grain boundaries 30a at the surface in contact with the via contact 18b. In other words, the area occupied by the crystal boundaries 30a at the surface where the conductive bump 20 is in contact with the via contact 18b is smaller in proportion. Consequently, there are reduced possibilities that impurities or the like enter into the conductive bump 20 through the crystal grain boundaries 30a, for instance, when the via contact 18b is formed on the upper surface of the conductive bump 20. As a result, the conductive bump 20 is less likely to be eroded by impurities or the like, and thus the connection reliability between the conductive bump 20 and the via contact 18b can be improved.

Furthermore, impurities or the like are less likely to reach the inside of a circuit element formed on the semiconductor substrate 12 through the conductive bump 20 or the electrode 14, so that malfunction of the circuit element can be avoided. Also, since the conductive bump 20 has size L2 of the crystal grains 30 in the X or Y direction parallel to the surface S of the semiconductor substrate 12 larger than size L1 thereof in the conduction direction Z, it has a shorter total length of crystal grain boundaries 30a at the surface in contact with the electrode 14, compared with the case where size L2 of the crystal grains 30 in the X or Y direction parallel to the surface of the semiconductor substrate 12 is the same or smaller than size L1 thereof in the conduction direction Z. In other words, the area occupied by the crystal boundaries 30a at the surface where the conductive bump 20 is in contact with the electrode 14 is smaller in proportion. Consequently, the conductive bump 20 has more area where the crystal portions having relatively lower resistance than the crystal grain boundaries are in contact with the electrode 14, thereby making the contact resistance between the conductive bump 20 and the electrode 14 smaller. As a result, useless heat generation can be prevented and power consumption of the circuit device 10 can be reduced.

When the conductive bump 20 is a rolled material in which an anisotropy of the size of crystal grains 30 has been created by a rolling process, the conductive bump 20 displays an improved rupture strength. Thus, compared with when the conductive bump 20 is formed by plating or the like, the conductive bump 20 is less likely to break when it is under stress, and this improves the connection reliability of the wiring.

Figure 3A:
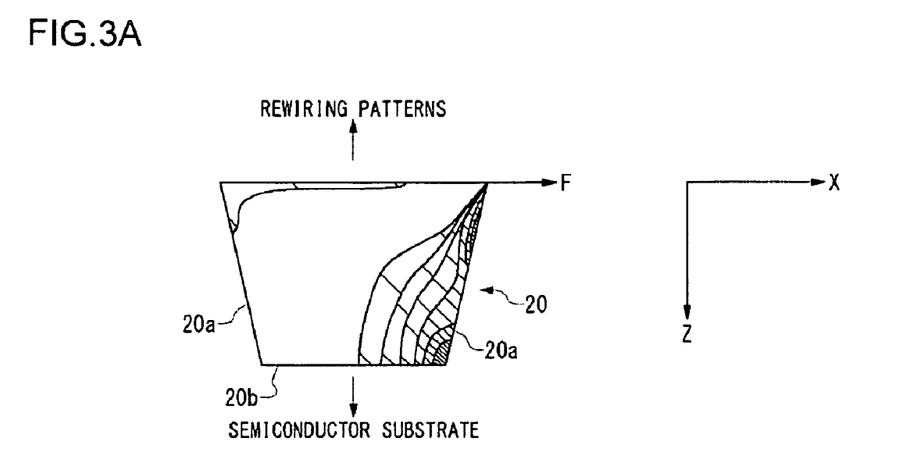
FIGS. 3A to 3C are schematic illustrations of stress distributions in a conductive bump simulated and calculated for different forms of the bump where a stress is given in the X direction of the conductive bump via a second wiring layer including a rewiring pattern.
Figure 3B:
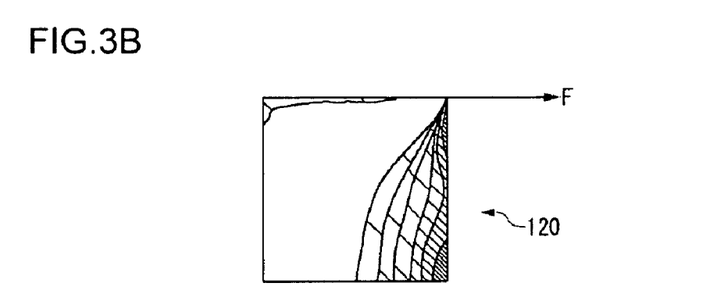
Figure 3C:
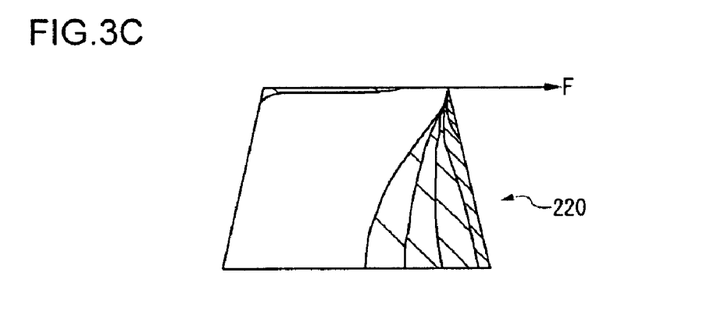

Next, a description will be given of the cases where the conductive bump is under stress. FIGS. 3A to 3C are schematic illustrations of stress distributions in the conductive bump 20 simulated and calculated for different forms of the conductive bump 20 where a stress is given in the X direction of the conductive bump 20 via the second wiring layer 18 including the rewiring pattern 18a.

Copper, which is the material of the rewiring pattern 18a, and silicon, which is the material of the semiconductor substrate 12 including the circuit element, have different coefficients of thermal expansion from each other. Therefore, due to thermal shock or heating in the circuit element, stress in the direction parallel to the surface S of the semiconductor substrate 12 can work on the conductive bump 20 via the second wiring layer 18.

For example, when stress F in the X direction parallel to the surface S of the semiconductor substrate 12 works at the connection between the conductive bump 20 and the via contact 18b, the stress distribution in the Z direction inside the conductive bump 20 varies depending on the form of the conductive bump 20. The conductive bump 20 according to the present embodiment shown in FIG. 3A is formed in such a shape that the area of cross section in parallel with the surface S of the semiconductor substrate 12 increases as it approaches the second wiring layer 18 from the electrode 14. That is, the conductive bump 20 has a side face part 20a formed at an obtuse angle with the contact face 20b in contact with the surface S of the semiconductor substrate 12. The conductive bump 120 shown in FIG. 3B is formed in such a shape that the area of cross section in parallel with the surface S of the semiconductor substrate 12 is constant as it approaches the second wiring layer 18 from the electrode 14. The conductive bump 220 shown in FIG. 3C is formed in such a shape that the area of cross section in parallel with the surface S of the semiconductor substrate 12 decreases as it approaches the second wiring layer 18 from the electrode 14.

Comparison of FIGS. 3A to 3C indicates that the stress distribution in the vicinity of a part where the conductive bump 20 is in contact with the electrode 14 is the greatest in strength and the widest for the shape shown in FIG. 3A. Note that the darker the shading, the greater the stress is. Accordingly, even when a stress results from heat, the conductive bump 20 of this shape comes under strong pressure from the electrode 14. This means a closer contact between the conductive bump 20 and the electrode 14, which means an improved connection reliability.

(Manufacturing Method of Circuit Device)

Figure 4A:
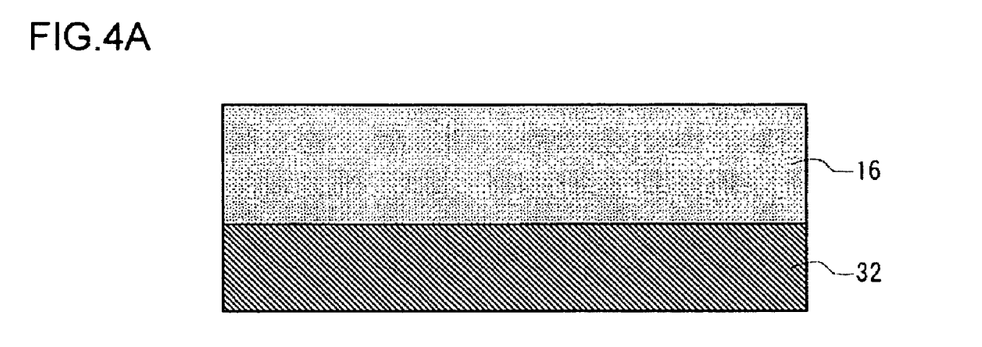
FIGS. 4A to 4C are schematic cross-sectional views for explaining a first process in the method for manufacturing a circuit device according to a first embodiment of the present invention.
Figure 4B:
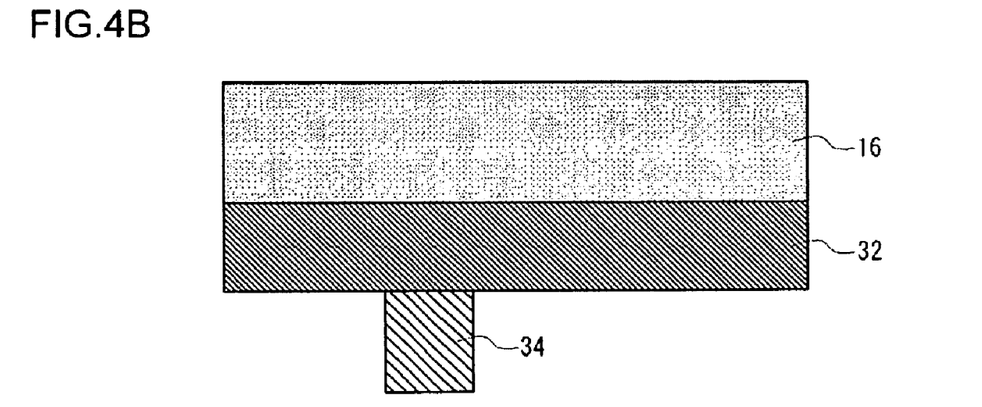
Figure 4C:
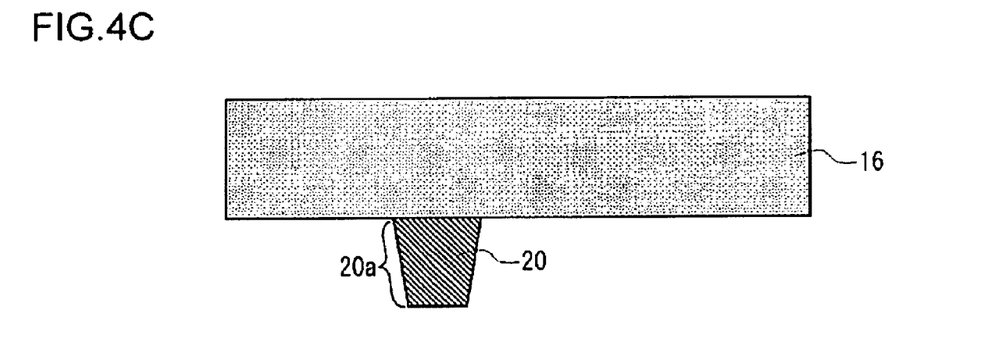
Figure 5A:
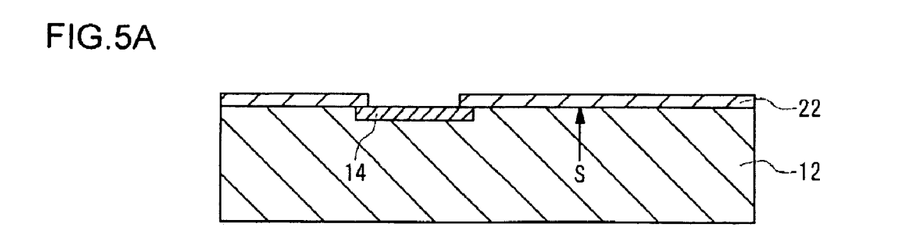
FIGS. 5A to 5C are schematic cross-sectional views for explaining a second process and a third process in the method for manufacturing a circuit device according to a first embodiment of the present invention.
Figure 5B:
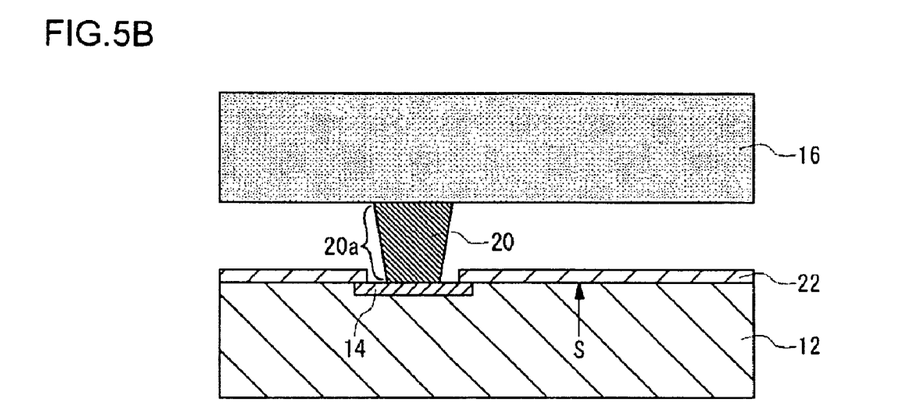
Figure 5C:
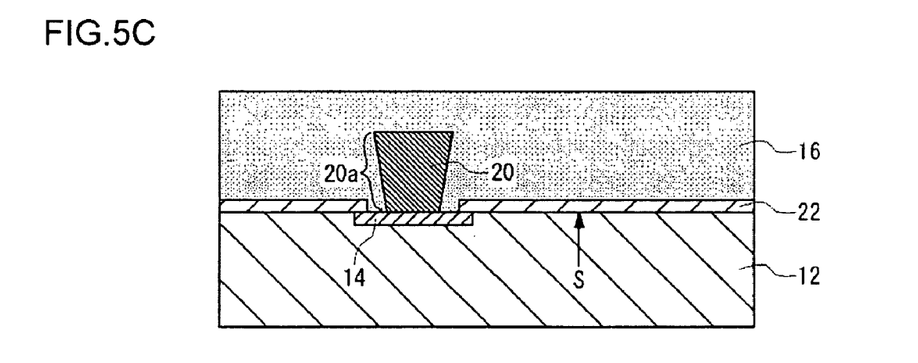
Figure 6A:
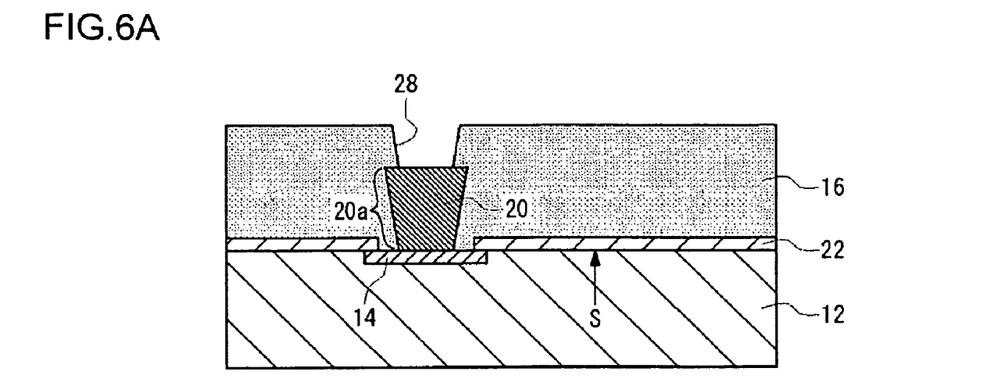
FIGS. 6A and 6B are schematic cross-sectional views for explaining a fourth process and a fifth process in the method for manufacturing a circuit device according to a first embodiment of the present invention.
Figure 6B:
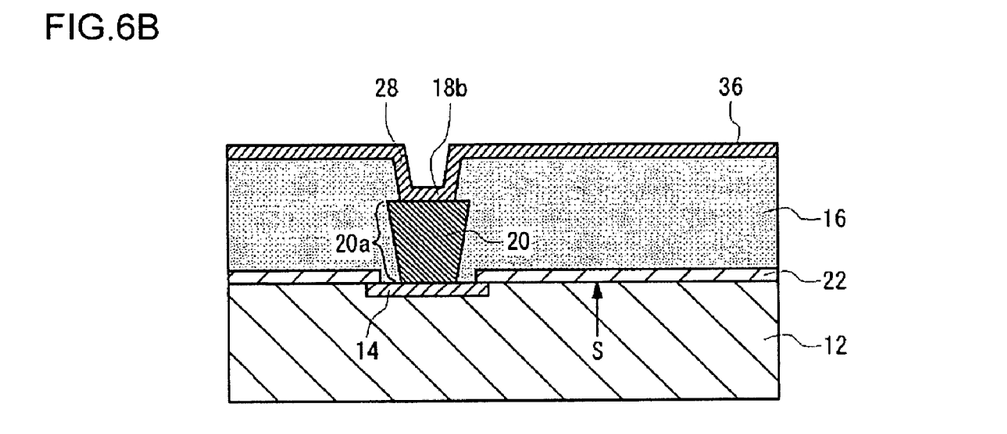

Now, referring to FIGS. 4A to 6B, a method for manufacturing a circuit device according to the first embodiment will be discussed. FIGS. 4A to 4C are schematic cross-sectional views for explaining a first process in the method for manufacturing a circuit device according to the first embodiment. FIGS. 5A to 5C are schematic cross-sectional views for explaining a second process and a third process in the method for manufacturing a circuit device according to the first embodiment. FIGS. 6A and 6B are schematic cross-sectional views for explaining a fourth process and a fifth process in the method for manufacturing a circuit device according to the first embodiment.

First, as shown in FIG. 4A, a copper foil 32 of about 50 μm thickness is bonded to one face of an insulating layer 16 of about 80 μm thickness, which is made of an epoxy thermosetting resin. Note that the copper foil 32 used here is a rolled material in which an anisotropy of the size of crystal grains has been created by a rolling process. This makes it possible to form a conductive bump 20 with greater ease and lower cost than when the conductive bump 20 is formed by plating. Next, as shown in FIG. 4B, a resist mask 34 is formed in a conductive bump forming area on the copper foil 32, using an ordinary lithography method. Here, the conductive bump forming area corresponds to the position of the electrode 14 of the semiconductor substrate 12 shown in FIG. 1.

Now, as shown in FIG. 4C, a conductive bump 20 having a predetermined circular truncated cone shape is formed by a wet etching process using a chemical and the resist mask 34 as the mask, and then the resist mask 34 is removed. At this time, the conductive bump 20 is so formed as to have a side face part 20a, which is increasingly smaller in diameter (size) closer to the tip end. That is, the conductive bump 20 has a side face part 20a formed at an acute angle with the face in contact with the surface of the insulating layer 16. In other words, the conductive bump 20 is formed in such a manner that the area of cross section parallel to the surface of the insulating layer 16 decreases in the direction perpendicular to the surface of the insulating layer 16. Thus, by the first process according to the present embodiment as illustrated in FIGS. 4A to 4C, a conductive bump 20 can be formed on one face of the insulating layer 16.

In the manufacturing method of a circuit device 10 according to the present embodiment, the height of the conductive bump 20 is about 50 μmφ, the diameter of the tip end of the conductive bump 20 is about 80 μmφ, and the diameter of the face at which the conductive bump 20 is in contact with the insulating layer 16 is about 100 μmφ. In each step of the above-described process, care is exercised not to heat to the thermosetting temperature so that the insulating layer 16, which is made of an epoxy thermosetting resin, is maintained in a half-cured (fluid) state without being completely thermally-cured.

Next, a description will be given of the second process, in which the electrode 14 as a first wiring layer is formed on the surface S of the semiconductor substrate 12 having a circuit element formed thereon, and the third process, in which the conductive bump 20 is embedded in the insulating layer 16 by press-bonding the semiconductor substrate 12 and the insulating layer 16 in a state where the electrode 14 is in contact with the conductive bump 20.

First, as shown in FIG. 5A, a predetermined circuit element (not shown) such as an electric circuit is formed by a known technology in a region near the surface S of the semiconductor substrate 12, which is for instance a p-type silicon substrate, and also an electrode 14 is formed by a known technology in the peripheral part or the upper part thereof. The electrode 14 is generally made of a metal such as aluminum. Then an insulating-type protective film 22 to protect the semiconductor substrate 12 is formed in a region on the surface S of the semiconductor substrate 12 such that a predetermined portion of the electrode 14 is exposed. The protective film 22 to be used may be a silicon dioxide film ($SiO_2$) or a silicon nitride film (SiN). Thus, by the second process according to the present embodiment as illustrated in FIG. 5A, the electrode 14 as a first wiring layer can be formed on the surface S of the semiconductor substrate 12 having a circuit element formed thereon.

Next, as shown in FIG. 5B, the semiconductor substrate 12 and the insulating layer 16 are placed in such a position that the electrode 14 is in contact with the tip end of the conductive bump 20. Then, in this state, press-forming is performed using a press unit, so that, as shown in FIG. 5C, the conductive bump 20 is embedded into the insulating layer 16, thus uniting the semiconductor substrate 12, the conductive bump 20 and the insulating layer 16 into a single body (embedding process).

Here the pressure for the press-forming using the press unit is about 5 MPa, and the temperature therefor is about 200° C. As a result of this press-forming, the viscosity of the insulating layer 16 drops, and thus the insulating layer 16 develops plastic flow. Hence, the conductive bump 20, while it is in contact with the electrode 14, is embedded self-aligningly in the insulating layer 16. In this embodiment, the thickness of the insulating layer 16 is about 80 μm and the height of the conductive bump 20 is about 50 μm, so that the conductive bump 20 is embedded by the press-forming into the insulating layer 16 without penetrating therethrough.

Immediately following the embedding of the conductive bump 20 in the insulating layer 16, a heat treatment (150° C., 30 minutes) to the insulating layer 16 is performed to completely cure the insulating layer 16. As a result, the insulating layer 16 is press-bonded fixedly to the semiconductor substrate 12, and at the same time the conductive bump 20, while it is pressed against the electrode 14, is fixed within the insulating layer 16. In this manner, by the third process according to the present embodiment as illustrated in FIGS. 5B and 5C, the semiconductor substrate 12 and the insulating layer 16 can be press-bonded together while the electrode 14 and the conductive bump 20 are in contact with each other, and the conductive bump 20 can be embedded in the insulating layer 16.

Next, a description will be given of the fourth process, in which the conductive bump 20 is exposed from the other face of the insulating layer 16, and the fifth process, in which a second wiring layer 18 is formed on the exposed portion of the conductive bump 20 and on the insulating layer 16.

As shown in FIG. 6A, an opening 28 is formed by laser irradiation from above the insulating layer 16 such that a portion of the conductive bump 20 is exposed. The laser irradiation here may use carbon dioxide laser, for instance. The laser irradiation is performed in two stages, one using predetermined first irradiation conditions and the other using predetermined second irradiation conditions with the pulse width of the first irradiation conditions changed. To be more precise, a laser of 1.0 W output may be used at a pulse period of 0.25 ms, and as the first irradiation conditions, the pulse width may be 8 to 10 μs and the number of shots may be 1. As the second irradiation conditions, the pulse width may be 3 to 5 μs, the pulse interval may be 25 ms, and the number of shots may be 3. Thereby, the opening 28 having a tapered side wall whose diameter decreases as it approaches the conductive bump 20 from the surface of the insulating layer 16 can be formed.

In the above-described first process, the conductive bump 20 is formed in such a manner that the area of cross section parallel to the surface of the insulating layer 16 decreases in the direction perpendicular to the surface of the insulating layer 16. Therefore, the conductive bump 20, which is embedded in the insulating layer 16 in the above-described third process, has a larger area of the portion thereof facing the upper face of the insulating layer 16 than the area of the face thereof in contact with the electrode 14. This makes positioning easier for via formation with laser to expose the conductive bump 20 from the other face of the insulating layer 16, which in turn contributes to reducing the manufacturing cost. Thus, by the fourth process (exposing process) according to the present embodiment as illustrated in FIG. 6A, the conductive bump 20 can be exposed from the other face of the insulating layer 16.

Next, as shown in FIG. 6B, a plating of copper in the thickness of about 20 μm is performed on the upper face of the insulating layer 16 and on the inner face of the opening 28, using an electroless plating and an electrolytic plating. As a result, a copper plating layer 36 having a thickness of about 20 μm is formed on the insulating layer 16, and at the same time a via contact 18b is formed inside the opening 28. It is to be noted that with the growth of copper on the conductive bump 20 by plating, the crystals grow in the Z direction as shown in FIG. 2 thereby forming the via contact 18b composed of columnar crystal grains.

Then, as illustrated in FIG. 1, a rewiring pattern 18a having predetermined line/space patterns is formed by processing the copper plating layer 36 (see FIG. 6B) by commonly known lithography and etching techniques. After this, the insulating layer 16 and the rewiring pattern 18a are covered by the solder resist layer 26 so that an opening is formed in an electrode pad forming area of the rewiring pattern 18a. The solder resist layer 26, which functions as a protective film for the rewiring pattern 18a, can be made of an epoxy resin or the like. The thickness of the solder resist layer 26 according to the present embodiment is about 40 μm, for instance.

Then, the solder bump 24, which functions as an external connection terminal, is formed by a solder printing method in the part of the rewiring pattern 18a exposed through the opening in solder resist layer 26. Thus, by the fifth process (wiring process) according to the present embodiment as illustrated in FIG. 6B, the second wiring layer 18 can be formed in a position, where the conductive bump 20 is exposed, and on the insulating layer 16.

Thus, a circuit device 10 as shown in FIG. 1 can be fabricated through the processes as heretofore described. According to the manufacturing method of a circuit device according to the first embodiment, the conductive bump 20 can be formed such that the size of the crystal grains in the direction parallel to the surface S of the semiconductor substrate 12 is larger than the size thereof in the conduction direction between the electrode 14 and the second wiring layer 18. Accordingly, compared with the case where the size of the crystal grains in the direction parallel to the surface S of the semiconductor substrate 12 is the same or smaller than size thereof in the conduction direction, the conductive bump 20 has a shorter total length of crystal grain boundaries at the surface in contact with the second wiring layer 18. In other words, the area occupied by the crystal boundaries at the surface where a conductor is in contact with the second wiring layer 18 is smaller in proportion. Consequently, it is possible to suppress the impurities or the like from entering into the conductive bump 20 through the crystal grain boundaries, for instance, when the second wiring layer 18 is formed on the upper surface of the conductive bump 20.

Also, the conductive bump 20 is less likely to be corroded by impurities or the like, and thus a circuit device can be fabricated in which the connection reliability between the conductive bump 20 and the second wiring layer 18 is improved. Furthermore, impurities or the like are less likely to reach the inside of a circuit element formed on the semiconductor substrate 12 through the conductive bump 20 or the electrode 14, so that malfunction of the circuit element can be avoided. Also, since the conductive bump 20 has the size of the crystal grains in the direction parallel to the surface of the semiconductor substrate 12 larger than the size thereof in the conduction direction, it has a shorter total length of crystal grain boundaries at the surface in contact with the electrode 14. In other words, the area occupied by the crystal boundaries at the surface where the conductive bump 20 is in contact with the electrode 14 is smaller in proportion. Consequently, the conductive bump 20 has more area where the crystal portions having lower resistance than the crystal grain boundaries are in contact with the electrode 14, thereby making the contact resistance between the conductive bump 20 and the electrode 14 smaller. As a result, useless heat generation can be prevented and power consumption of the circuit device can be reduced.

Second Embodiment

Figure 7:
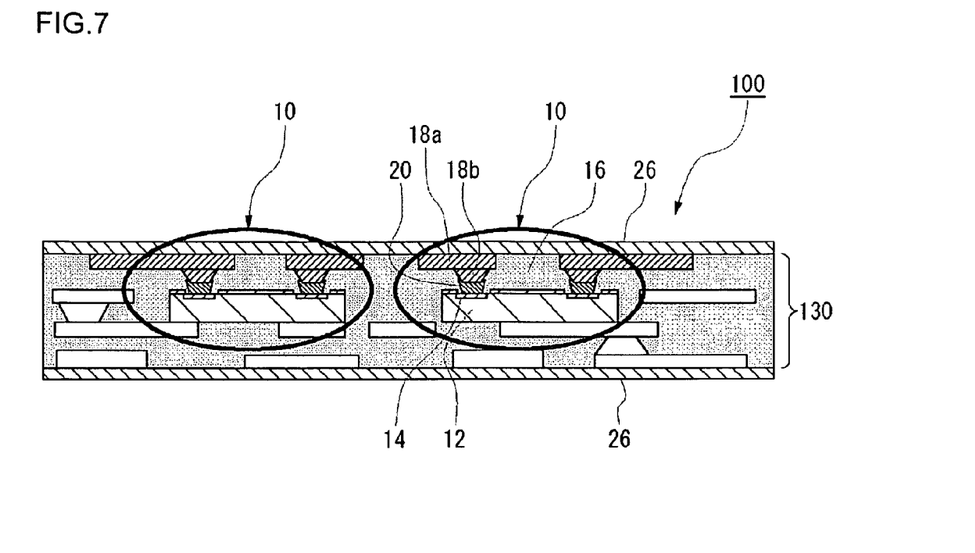
FIG. 7 is a schematic cross-sectional view illustrating a structure of a semiconductor module according to a second embodiment of the present invention.

FIG. 7 is a schematic cross sectional view illustrating a structure of a semiconductor module according to a second embodiment of the present invention. The semiconductor module 100 according to the second embodiment has a plurality of the above-described circuit devices 10 therewithin. Also, the semiconductor module 100 includes a wiring structure 130 where the circuit devices electrically conduct to their respective external connection terminals (not shown). In the following description, the same features as those of the first embodiment will be denoted with the same reference numerals, and the description thereof will be omitted. With the semiconductor module 100 according to the second embodiment, the same advantageous effects as those of the first embodiment can be obtained.

The present invention has been described by referring to each of the above-described embodiments. However, the present invention is not limited to the above-described embodiments only, and those resulting from any combination of them or substitution as appropriate are also within the scope of the present invention. Also, it is understood that various modifications, such as the order in which a circuit device is manufactured being modified as appropriate and changes in design made in a circuit device based on the knowledge of those skilled in the art, and the embodiments added with such modifications are also within the scope of the present invention.

In the foregoing embodiments, an example has been described in which the via contact 18b is provided in such a manner as to cover the inside of the opening 28. However, the opening dimension of the opening 28 may be narrowed, and the via contact 18b may be formed such that the inside of the opening 28 may be completely filled with copper plating by adding a suppressor and an accelerator in the plating solution when a rewiring pattern 18a including the via contact 18b is formed. This can produce a low-resistance via contact area (the conductive bump 20 and the via contact 18b).

Also, in the foregoing embodiments, an example has been described in which a via contact area connecting the electrode 14 of the semiconductor substrate 12 with the rewiring pattern 18a is provided. However, the via contact area can be applied to the connection between a lower wiring layer and an upper wiring layer within a multilayer wiring substrate, for instance. In such an arrangement, the production stability of the multilayer wiring substrate can be improved, and the multilayer wiring substrate can be manufactured at lower cost.

Also, in the foregoing embodiments, an example has been described in which the manufacturing process includes the second process for forming a first wiring layer on the surface of a substrate with a circuit element formed thereon. However, a preparation process, instead of the second process, may be employed by which a semiconductor substrate 12 formed with an electrode 14, which is the first wiring layer connected to the circuit element, is prepared. Thus, after the semiconductor substrate 12 is prepared by the preparation process, (1) an embedding process, in which the semiconductor substrate 12 and the insulation layer 16 are press-bonded together and thereby the conductive bump 20 is embedded into the insulation layer 16 while the electrode 14 provided on the surface of the semiconductor 12 is held in contact with the conductive bump 20 formed on one face of the insulating layer 16, (2) an exposing process, in which the conductive bump 20 is exposed from the other face of the insulating layer 16, and (3) a wiring process, in which a second wiring layer 18 is formed on the exposed portion of the conductive bump 20 and on the insulating layer 16, may be carried out so as to complete the manufacturing of the circuit device according to the foregoing embodiments. Note that in the embedding process as described above, an insulating layer with a conductive bump 20 formed on one face thereof may be prepared in advance and used instead of the insulating layer 16 made in the first process.

While the preferred embodiments of the present invention and the modifications to the embodiments have been described using specific terms, such description is for illustrative purposes only, and it is to be understood that changes and variations may further be made without departing from the spirit or scope of the appended claims.

What is claimed is:

1. A circuit device, comprising:
   a substrate on which a circuit element is formed;
   a first wiring layer formed on a surface of said substrate;
   an insulating layer formed on said first wiring layer;

a second wiring layer formed on said insulating layer; and a conductor which penetrates said insulating layer and which electrically connects said first wiring layer to said second wiring layer, wherein said conductor has crystal grains, wherein a length of the crystal grains in a direction parallel with the surface of said substrate is larger than a length of crystal grains in a conducting direction between said first wiring layer and said second wiring layer.

2. A circuit device according to claim 1, wherein said conductor is a rolled material where an anisotropy in the size of crystal grains thereof is formed by a rolling process.

3. A circuit device according to claim 1, wherein said conductor has a side face formed at an obtuse angle with a face in contact with the surface of said substrate.

4. A circuit device according to claim 2, wherein said conductor has a side face formed at an obtuse angle with a face in contact with the surface of said substrate.

5. A semiconductor module, wherein a plurality of circuit devices according to claim 1 are incorporated therein, said semiconductor module having a wiring structure where each of the plurality of circuit devices conducts electrically to an external connection terminal.

6. A circuit device according to claim 1, wherein the conducting direction is perpendicular to the surface of said substrate.

7. A method for manufacturing a circuit device, the method including:
- a first process of forming a conductor on one of surfaces of an insulating layer;
- a second process of forming a first wiring layer on a surface of a substrate on which the circuit device is formed;
- a third process of embedding the conductor in the insulating layer by press-bonding the substrate and the insulating layer in a state where the first wiring layer is in contact with the conductor;
- a fourth process of exposing the conductor from the other surface of the insulating layer; and
- a fifth process of providing a second wiring layer in a position, where the conductor is exposed, and on the insulating layer, wherein the conductor is formed in such a manner that the length of crystal grains in a direction parallel with the surface of the substrate is larger than the length of crystal grains in a conduction direction of the first wiring layer and the second wiring layer.

8. A method for manufacturing a circuit device according to claim 7, wherein, in said first process, the conductor is formed using a rolled material where an anisotropy in the size of crystal grains thereof is formed by a rolling process.

9. A method for manufacturing a circuit device according to claim 7, wherein, in said first process, the conductor is formed such that the conductor has a side face formed at an acute angle with a face in contact with the insulating layer.

10. A method for manufacturing a circuit device according to claim 8, wherein, in said first process, the conductor is formed such that the conductor has a side face formed at an acute angle with a face in contact with the insulating layer.

11. A method for manufacturing a circuit device, the method including:
- an embedding process of embedding a conductor in an insulating layer by press-bonding a substrate and the insulating layer in a state where a first wiring layer formed on the surface of the substrate on which the circuit device is formed is in contact with the conductor formed on one of surfaces of the insulating layer;
- an exposing process of exposing the conductor from the other surface of the insulating layer; and
- a wiring process of providing a second wiring layer in a position, where the conductor is exposed, and on the insulating layer, wherein the conductor is formed in such a manner that the length of crystal grains in a direction parallel with the surface of the substrate is larger than the length of crystal grains in a conduction direction of the first wiring layer and the second wiring layer.

* * * * *